Feb. 2, 1954 C. T. McCOY 2,668,236

ELECTRICAL PULSE-WIDTH DISCRIMINATOR

Filed Sept. 23, 1944

INVENTOR.
Claudius T. McCoy
BY
Howson & Howson
Attys.

Patented Feb. 2, 1954

2,668,236

UNITED STATES PATENT OFFICE 2,668,236

ELECTRICAL PULSE-WIDTH DISCRIMINATOR

Claudius T. McCoy, Narberth, Pa., assignor, by mesne assignments, to Philco Corporation, Philadelphia, Pa., a corporation of Pennsylvania Application September 23, 1944, Serial No. 555,504

10 Claims. (Cl. 250—27)

Figure 1:
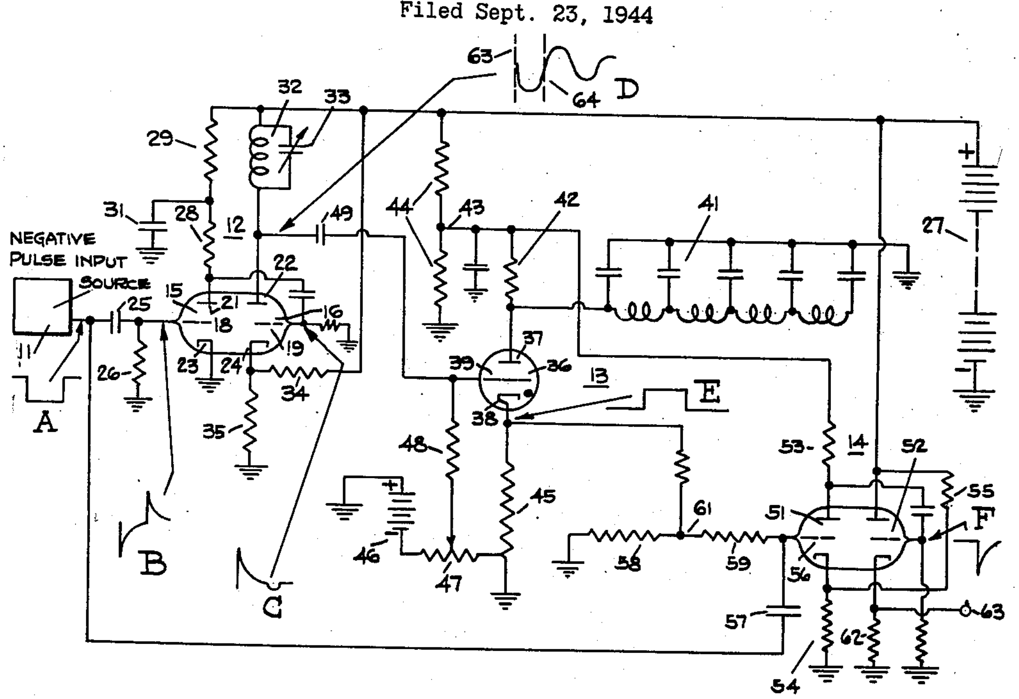

The present invention relates to signal selective circuits. An object of the invention is to provide an improved time responsive circuit and to provide methods for selecting signals according to the time of duration.

A further object of the invention is to provide an improved pulse width discriminator.

It is also an object of the invention to provide electronic circuits for eliminating undesired signals.

Still another object of the invention is to provide methods and apparatus for providing secrecy in radar or radio object detection apparatus, and to provide for freeing such systems from danger of pulse jamming.

Still another object of the invention is to provide a selector for television synchronization signals.

Other and further objects, features and advantages of the invention will become apparent as the description proceeds.

In carrying out the invention in accordance with a preferred embodiment thereof, an input pulse source is arranged to provide negative pulses, preferably of substantially square or rectangular wave form. Means are provided for converting the leading and trailing edges of the rectangular pulse to positive pips or spikes. Suitable delay means such as an inductance-capacity tuned circuit providing accurate delay is provided for introducing delay measured from the initial positive spike. A gas discharge circuit controlled by a delay line or the like is provided to produce a rectangular positive wave which serves as a control wave; and the gas discharge circuit is arranged to be triggered by the delayed counterpart of the positive spike.

A control tube is provided having a control electrode energized by the aforesaid rectangular control wave and having an input from the second positive spike corresponding to the trailing edge of the negative pulse input source. The control tube is so arranged that it passes signals only when rendered conducting by the rectangular control wave. Accordingly, the second positive spike corresponding to the trailing edge of the negative pulse input source will pass the control tube only when the trailing edge of such input pulse occurs during the time duration of the control wave. Accordingly, the degree of selectivity of the apparatus with respect to pulse duration may be fixed by selecting the length of the control wave, and the minimum length of pulse passed may be fixed by fixing the delay provided by the delay circuit represented by the inductance-capacity tuned circuit.

Although in the arrangement illustrated, a gas-discharge tube and a delay line are utilized for producing a fixed-duration control wave, and a tuned circuit is utilized for delaying the control wave, the invention is not limited thereto. Any suitable delay devices, such as multi-vibrator circuits, e. g., may be employed for either of the delay devices, depending upon the degree of precision required.

A better understanding of the invention will be afforded by the following detailed description considered in conjunction with the accompanying drawing, and the scope of the invention will be set forth in the claims appended hereto.

In the drawing, Fig. 1 is a circuit diagram of one embodiment of the invention.

Figure 2:
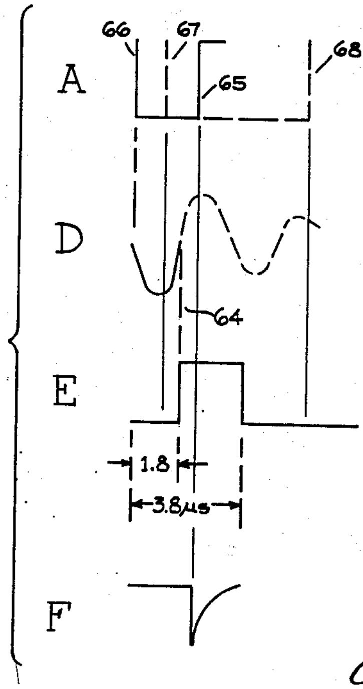

In Fig. 2 is a set of graphs illustrative of the principles of operation of the apparatus of Fig. 1.

Fig. 1 illustrates a circuit for selectively passing a pulse A of negative rectangular wave form supplied by an input source 11. A pulse shaping and delay circuit 12 is provided for converting the leading edge of the pulse A into a positive spike and delaying the spike sufficiently. A wave forming circuit 13 responsive to the delayed output of the circuit 12 is provided for forming a rectangular control wave E. A gating or control stage 14 is provided which is jointly responsive to the output of the control wave circuit 13, and the trailing edge of the pulse A supplied by the negative input source 11.

In the arrangement illustrated, the pulse forming circuit 12 comprises a pair of space discharge valves 15 and 16 represented as units of a double triode vacuum tube having control electrodes 18 and 19, anodes or plates 21 and 22, and cathodes 23 and 24, respectively.

For coupling the control electrode 18 to the negative input source 11, a differentiating circuit is provided comprising a condenser 25 and a grid resistor 26 connected in series to the source 11 with a junction terminal connected to the control electrode 18.

The control electrode 19 of the unit 16 is capacity coupled to the anode 21 of the unit 15.

For energizing the triode units 15 and 16, a suitable source of current or a power supply device such as a B battery 27 is provided having a positive terminal connected to the anodes 21 and 22. The anode 21 is connected through a load resistor 28 and a conventional decoupling circuit represented by a resistor 29 and a condenser 31. The resistor 29 also functions to lower the voltage applied to anode 21; the effect of this is to make the tube 15 cut off at a lower signal level, and thus make it more independent of signal amplitude.

For introducing the desired delay in output of the unit 16, a tuned circuit represented by an inductance 32 and a parallel condenser 33 is interposed between the anode 22 and the positive terminal of the power supply 27.

For normally biasing the triode unit 16 to a non-conducting condition, a bleeder resistor 34 is provided, connecting the cathode 24 to the positive terminal of the power supply 27, and the cathode 24 is grounded through a cathode bias resistor 35.

The control wave forming circuit 13 includes an electric discharge device 36 of the type which remains conducting after it has been ignited so long as a source of adequate supply voltage remains connected thereto. For example, a gas discharge or vapor discharge type of tube may be employed such as those known as Thyratron tubes. The tube 36 includes an anode 37, a cathode 38 and a control electrode 39.

The control wave forming circuit 13 includes in addition to the tube 36 a delay line 41 connected between the anode 37 and a point of fixed potential such as ground. The delay line 41 may be any conventional type of delay line, preferably open circuited at the far end in order to reflect voltage signals with unchanged polarity. For simplicity the delay line is represented schematically as a system of lumped inductance and capacity units with the inductance units connected at one end to the anode 37 and the capacity units connected between ground and taps on the inductance units.

The Thyratron tube 36 is provided with an anode resistor 42 connected to the positive terminal of the power supply 27, preferably through voltage dropping means arranged as a decoupling net-work. For example, the load resistor 42 may be connected to a tap 43 on a voltage dividing resistor 44 connected to the power supply 27. For providing a cathode follower connection, a cathode resistor 45 is connected in series with the cathode 38 and the ground terminal of the power supply 27. Adjustable means are provided for negatively biasing the control grid 39. For example, a C battery 46 may be provided having a potentiometer 47 connected to the negative terminal thereof with the control grid 39 connected to the potentiometer tap through a grid resistor 48. The control grid 39 is provided with a coupling to the output terminal or anode 22 of the tube 16 by means of a condenser 49 and the grid resistor 48.

The gating or control stage 14 comprises a pair of electric discharge means, preferably of the vacuum tube type for example, such as triode units 51 and 52, each having a conventional anode, cathode and control electrode or grid elements. The triode unit 51 has an anode load resistor 53 connected to the terminal 43 of the voltage divider 44 and has a cathode resistor 54 connected to the positive terminal of the power supply 27 through a bleeder resistor 55. The tube 51 has a control electrode or grid 56 coupled to the output of the negative pulse source 11 by a condenser 57. The grid 56 is biased to the cathode voltage of the Thyratron tube 36 by means of grid resistors 58 and 59 connected in series between ground and the grid 56 with a junction terminal 61 connected to the cathode 38 of the tube 36.

The triode unit 52 is directly connected to the positive terminal of the power supply 27, and it has a cathode resistor 62 with an output terminal 63 to which apparatus may be connected which is to be selectively responsive to the pulse source 11. The unit 52 is resistance capacity coupled in the conventional manner to the anode of the unit 51.

The manner of operation of the apparatus is indicated by symbolic wave forms having arrows directed to various points in the circuit. The output of the negative input source 11 is a negative rectangular wave A. This wave is differentiated by the capacity-resistor combination 25—26 to form a wave B having negative and positive spikes representing the leading and trailing edges of the rectangular wave A. The triode unit 16 acts as an inverter to invert the wave form B into the wave form C at the grid 19 of the triode unit 16. The negative spike of the wave B is converted into a positive spike; however, the positive spike of the wave B is substantially eliminated owing to the fact that the control grid 18 with the cathode 23 of the unit 15 acts as a diode tending to absorb the positive spike.

Owing to the presence of the positive cathode bias provided by the bleeder 34, the triode unit 16 is normally non-conducting, and when the positive spike of the wave C is applied to its grid, a surge of current is drawn through the inductance 32. The triode unit 16 remains conducting only momentarily so that the tuned circuit 32—33 is immediately unloaded and the surge of current drawn through the inductance 32 sets up a train of oscillations to produce a decaying sinusodial voltage at the anode 22, represented by the wave D. The first half cycle of the wave D is negative.

The tuned circuit 32—33 is preferably provided with sufficient loss to cause the sine wave D to be damped out to a relatively low value after the first positive half cycle or means are provided for extinguishing the wave D after the first positive half cycle.

When the voltage at the anode 22 is driven negative by the first half cycle of the wave D between the dotted lines 63 and 64, there is no effect at first on the tube 36. However, upon recovery of the voltage immediately after the time represented by the dotted line 64, the grid 39 of the tube 36 is driven positive and the tube 36 becomes conducting. Since the tube 36 is of the gaseous discharge type or Thyratron type, it remains conducting thereafter so long as the anode 37 is at a sufficiently high positive potential. When current is drawn by the tube 36 through the load resistor 42, the anode 37 is driven negative and a negative wave is transmitted through the delay line 41, which is returned after the time represented by twice the delay time of the line 41. The return wave drives the anode 37 so far negative as to cut the tube off. Since the control of the tube 36 depends upon the grid 39 being negative after the initial impulse is applied thereto, the bias provided by the potentiometer 47 is so set that subsequent positive cycles of the damped wave D are insufficient to re-ignite the tube 36.

During the period that the tube 36 is conducting current, the cathode 38 is held at positive potential and a wave E is produced having a time duration determined by twice the delay time of the delay line 41. The constants of the circuits are so chosen that the amplitude of the wave E raises the grid 56 of the tube unit 51 to the operating level and permits a voltage applied through the coupling condenser 57 to pass through the tube unit 51. Since the cathode of the triode unit 51 is connected to a positive source by the bleeder 55, the triode 51 is normally cut-off and becomes capable of passing a signal only when the control grid voltage is raised by the control wave E.

The polarity of the signal supplied to the control grid 53 is reversed by the anode connections of the unit 51, and accordingly a negative spike F appears at the control grid of the triode unit 52 and also at the cathode connected output terminal 63. The resistance-capacity circuit 57, 58, 59 acts as differentiating circuit to convert the trailing edge of the wave A into a positive spike.

The negative square wave A may also be considered as a negative voltage variation followed after a certain time by a positive voltage variation. Accordingly, the apparatus may be employed, if desired, for selectively passing pairs of opposite-polarity spike signals, wave fronts, or voltage variations according to the time spacing between such voltage variations of opposite polarity.

In Fig. 2 the significant wave forms symbolically shown in Fig. 1 are redrawn to larger scale. It is assumed for the sake of illustration that the constants of the tuned circuit 32—33 are such as to introduce a delay of 1.8 micro-seconds, and that the constants of the delay line 41 are such as to produce a control wave E having a duration of 2 micro-seconds. It will be apparent that the duration of the first half cycle of the wave B will be 1.8 micro-seconds, and accordingly the leading edge of the wave E will occur 1.8 micro-seconds after the leading edge of the input wave A.

If the trailing edge 65 of the wave A occurs between 1.8 micro-seconds and 3.8 micro-seconds after the leading edge 66, the negative spike F will be passed through the triode unit 52 for the reason that the trailing edge of the wave A will occur during the time represented by the control wave E during which the grid 56 of the unit 51 is raised to its operating level of potential. On the other hand if the length of the pulse A is less than 1.8 micro-seconds or more than 3.8 micro-seconds, the trailing edge 65 will have occurred at a time when the unit 51 is cut-off, and consequently no signal will be passed through the stage 14. In this manner the apparatus acts to eliminate signals having time duration less than a predetermined length or greater than the predetermined length.

Thus, an input pulse of short duration having a trailing edge represented by the dotted line 67 will be eliminated and likewise a pulse of long duration having a trailing edge represented by the dotted line 68.

This characteristic may be utilized in connection with radar apparatus where it is desired to eliminate jamming of receivers by pulse signals supplied by spurious sources. The invention is not limited to the use in connection with radar anti-jamming the devices, however, and may be utilized wherever it is necessary to select signals according to the time of duration. For example in connection with television circuits where synchronizing pulses of a rectangular wave form are employed, circuits such as described herein may be utilized for causing only genuine synchronizing signals to be accepted by the synchronizing circuits of the apparatus.

In accordance with the provisions of the patent statutes, the principle of operation of the invention has been described together with the apparatus now believed to represent the best embodiment thereof, but it is to be understood that the apparatus shown and described is only illustrative, and that the invention may be carried out by other arrangements.

I claim:

1. An electrical pulse-width discriminator comprising, in combination, a source of input pulses, a first time-delay means responsive to a pulse from said source for establishing a control pulse whose leading edge is delayed a predetermined time after the leading edge of the initiating pulse, a second time-delay means for fixing the time-duration of said control pulse, means responsive to said initiating pulse for producing a narrow pulse timed with the trailing edge of said initiating pulse, and a pulse transfer network jointly responsive to said control pulse and to said narrow pulse for transferring said narrow pulse only when said narrow pulse occurs within the time interval occupied by said control pulse.

2. An electrical pulse-width discriminator comprising, in combination, an input circuit to which a signal pulse is applied, means responsive to said signal pulse for producing a first narrow pulse timed with the leading edge of said signal pulse, means responsive to said signal pulse for producing a second narrow pulse timed with the trailing edge of said signal pulse, a first time delay means responsive to said first narrow pulse for establishing a control pulse whose leading edge is delayed a predetermined time after the occurrence of said first narrow pulse, a second time-delay means for fixing the time-duration of said control pulse, an electronic gate circuit having input terminals and control terminals, said gate being normally closed to the passage of a signal therethrough, connections for applying said control pulse to the control terminals of said gate circuit, said gate being open to the passage of signal only in the presence of said control pulse, and connections for applying said second narrow pulse to the input terminals of said gate, said last-named pulse passing through said gate only when said signal pulse is of such duration that its trailing edge occurs in the interval occupied by said time-delayed control pulse.

3. An electrical pulse-width discriminator comprising, in combination, a source of input pulses, a time-delay means responsive to a pulse from said source for establishing a control pulse whose leading edge is delayed a predetermined time after the leading edge of the initiating pulse, means for fixing the time-duration of said control pulse, means responsive to said initiating pulse for producing a narrow pulse timed with the trailing edge of said initiating pulse, and a pulse transfer network jointly responsive to said control pulse and to said narrow pulse for transferring said narrow pulse only when said narrow pulse occurs within the time interval occupied by said control pulse.

4. A method of pulse duration discrimination comprising, producing from incoming pulses pulses which establish with respect to the leading edges of said incoming pulses a preselected interval of time, producing pulses from the trailing edges of said incoming pulses, and accepting pulses only when said trailing edge pulses and said first produced pulses are in synchronism.

5. A method of pulse duration discrimination comprising, producing in response to and a preselected interval of time after the leading edges of incoming electrical impulses pulses of preselected duration, producing pulses from the trailing edges of said incoming electrical impulses, combining said trailing edge pulses and said pulses of preselected duration which are synchronous, and producing output pulses only in response to said synchronous combination.

6. A pulse width discriminator comprising, vacuum tube means generating in response to the leading edges of applied electrical impulses pulses which are preselectably time related to said leading edges, means generating, in response to first said generated pulses, pulses of preselected duration, means generating pulses from the trailing edges of said applied electrical impulses, means combining said trailing edge pulses and said pulses of preselected duration which are synchronous, and means producing output pulses only in response to said synchronous combination.

7. A receiving system for recognizing a signal pulse of predetermined time duration having maximum and minimum limits comprising an input channel for receiving said signal pulse, a normally closed blocking device connected in said input channel, an output channel operatively connected to said input channel when said blocking device is open, first means in said input channel for initiating a first control pulse therein of fixed time duration in response to the leading edge of said signal pulse, second means in said input channel serially connected to said first means for initiating a second control pulse therein of such time duration that the total time duration of the first and second control pulses equals said minimum limit of time duration of the signal pulse, third means in said input channel serially connected to said second means for initiating a third control pulse therein of a time duration equal to the difference between said maximum and minimum limits of signal pulse time duration, said last-mentioned means being connected to the input of said blocking device, said third control pulse operating to open said blocking device to operatively interconnect said output and input channels, and means in said input channel responsive to the trailing edge of said signal pulse for producing a pulse of shorter time duration than said third control pulse in said output channel while the blocking device is open.

8. A method of pulse duration discrimination comprising, producing from incoming pulses pulses which are preselectably time related to the leading edges of the incoming pulses, producing pulses from the trailing edges of said incoming pulses, and accepting pulses only when said trailing edge pulses and said first produced pulses are in synchronism.

9. A pulse width discriminator comprising, vacuum tube means generating in response to applied electrical impulses pulses which are preselectably time related to said applied electrical impulses, means generating pulses from the trailing edges of said applied electrical impulses, means combining said first generated pulses and said trailing edge pulses which are synchronous, and means producing output pulses only in response to said synchronous combination.

10. A pulse width discriminator comprising, vacuum tube means generating in response to the leading edges of applied electrical impulses pulses which are preselectably time related to said leading edges, means generating pulses from the trailing edges of said applied electrical impulses, means combining said first generated pulses and said trailing edge pulses which are synchronous, and means producing output pulses only in response to said synchronous combination.

CLAUDIUS T. McCOY.

References Cited in the file of this patent

UNITED STATES PATENTS

| Number | Name | Date |
|---|---|---|
| 2,153,202 | Nichols | Apr. 4, 1939 |
| 2,211,942 | White | Aug. 20, 1940 |
| 2,217,957 | Lewis | Oct. 15, 1940 |
| 2,266,154 | Blumlein | Dec. 16, 1941 |
| 2,402,916 | Schroeder | June 25, 1946 |
| 2,418,127 | Labin | Apr. 1, 1947 |

FOREIGN PATENTS

| Number | Country | Date |
|---|---|---|
| 528,192 | Great Britain | Oct. 24, 1940 |